United States Patent [19]

Macovski

[11] Patent Number: 5,296,808
[45] Date of Patent: Mar. 22, 1994

[54] MRI IMAGING SYSTEM WITHOUT ALIASING

[76] Inventor: Albert Macovski, 2505 Alpine Rd., Menlo Park, Calif. 94025

[21] Appl. No.: 966,357

[22] Filed: Oct. 26, 1992

[51] Int. Cl.$^5$ ............................................. G01V 3/00
[52] U.S. Cl. ..................................... 324/309; 324/307
[58] Field of Search ................ 324/307, 309, 312, 318

[56] References Cited

U.S. PATENT DOCUMENTS

| | | | |
|---|---|---|---|
| 4,691,162 | 9/1987 | Van Vijen | 324/309 |
| 4,727,325 | 2/1988 | Matsui et al. | 324/309 |
| 4,794,337 | 12/1988 | Twieg | 324/318 |
| 4,812,760 | 3/1989 | Bottomley et al. | 324/309 |

*Primary Examiner*—Louis Arana

[57] ABSTRACT

A high frequency oscillatory signal is added to the gradient waveform to provide a blurring or convolution prior to sampling. The received signal can be modulated to provide the desired space-limiting function and thus avoid aliasing. The received signal is filtered prior to sampling to remove these high frequency signals.

9 Claims, 4 Drawing Sheets

MRI IMAGING SYSTEM WITHOUT ALIASING

1. Field of the Invention

This invention relates primarily to magnetic resonance imaging systems. In a primary application this invention relates to limiting the field of view to avoid aliasing.

2. Description of Prior Art

Magnetic Resonance Imaging has become one of the wider-used modalities in the field of medical imaging. A descriptive series of papers on NMR imaging appeared in the June 1980 series of the IEEE Transactions on Nuclear Science, Vol. NS-27, pp 1220–1255. The basic concepts are covered in the lead article, "Introduction to the Principles of NMR" by W. V. House, pp. 1220–1226.

In general, in an MRI imaging system, the object being studied is within a highly-uniform intense static magnetic field. The object is then excited by a high-power radio frequency burst which causes the magnetic moments in the object, which were lined up with the static field, to precess normal to the static field. Using spatially orthogonal gradients, these magnetic moments become spatially varying. A receiver coil picks up the signals from the precessing moments. This signal is processed to create images of the magnetic moment density in the object.

These systems have a large number of theoretical and practical problems. One of the most serious is aliasing, resulting from the discrete sampling of k-space. This results in the superposition of different portions of the object onto the image. In a typical system k-space is scanned in a raster format, continuous in the x dimension and sampled in the y dimension. The field of view in the x direction is thus easily determined by the bandwidth of the receiver filter prior to sampling. However, in the y dimension there is presently no receiver mechanism for limiting the field of view. Thus either the extent of the body part, or the extent of the coil pattern, or the extent of the excitation field is used to avoid aliasing. Very often this is either unsatisfactory or results in the use of a higher sampling density, using additional scan lines, which increases acquisition time.

A number of systems have been proposed which use time-varying gradients to scan all of k-space, thus defining the impulse response. One of the earliest papers in this field is that by W. S. Hinshaw entitled "Image Formation by Nuclear Magnetic Resonance: The Sensitive-Point Method", in the Journal of Applied Physics, Vol. 47, pp. 3709–3721, August 1967. This same approach became the subject of British Pat. No. 1,508,438 and U.S. Pat. No. 4,015,196. In this approach, orthogonal sinusoids were applied to each of the gradient axes in order to image the null point. This involved a scan of all of k-space in each dimension. Another approach was described in a paper by P. Mansfield and I. L. Pykett in the Journal of Magnetic Resonance, vol.29, p. 355, 1978. Here a squarewave was applied to one gradient axis and a constant to the orthogonal gradient in order to provide a raster scan of k-space. An improved system of time-varying gradients is described in U.S. Pat. No. 4,639,671 issued to Albert Macovski. Here methods are described of processing the received data to image every point in the object and to weight the signal to improve the point-spread function. These uses of time-varying gradients do not address the important problem of aliasing where overlap of different parts of the object can occur in the direction where k-space is sampled.

SUMMARY OF THE INVENTION

An object of this invention is to produce MRI images of the body without spatial aliasing. A further object of this invention is to produce MRI images of the body using the minimum amount of k-space data to enable rapid data acquisition.

Briefly, in accordance with this invention, a high-frequency scan is added to the conventional k-space scan to provide a convolution function in the sampled dimension. The received signal is also modulated at the same rate as the high frequency scan to provide the desired space-limiting function, which avoids aliasing.

BRIEF OF THE DRAWINGS

Figure 3A:
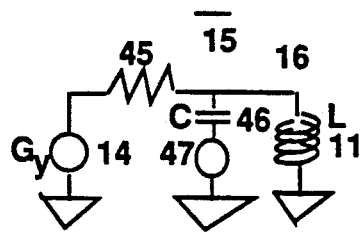
FIG. 3A is a diagram of a generator embodiment of the invention using sinusoids.
Figure 3B:
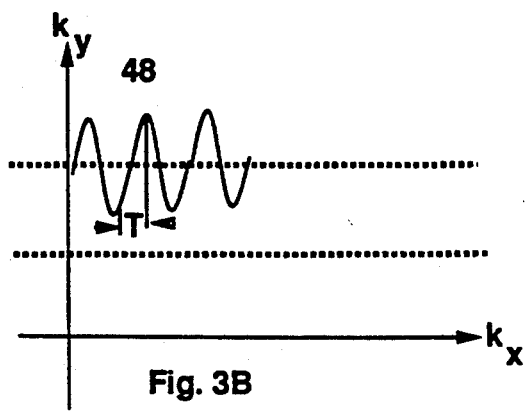
Figure 3C:
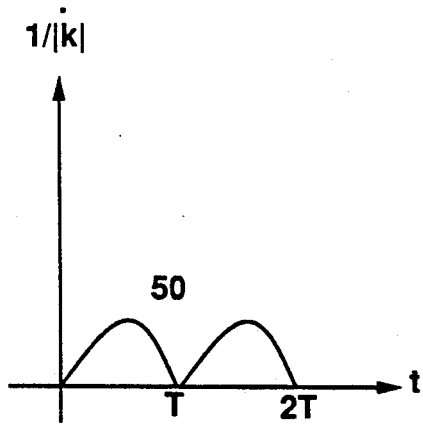
Figure 3D:
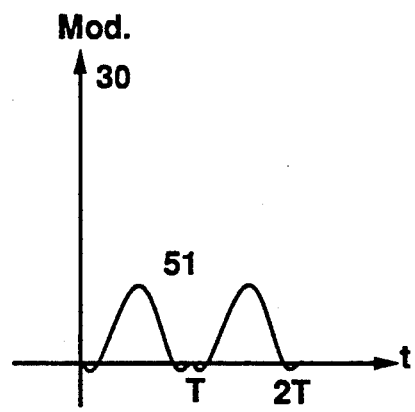

FIGS. 3B, 3C and 3D waveforms used in the sinusoidal embodiment of the invention.

Figure 4:
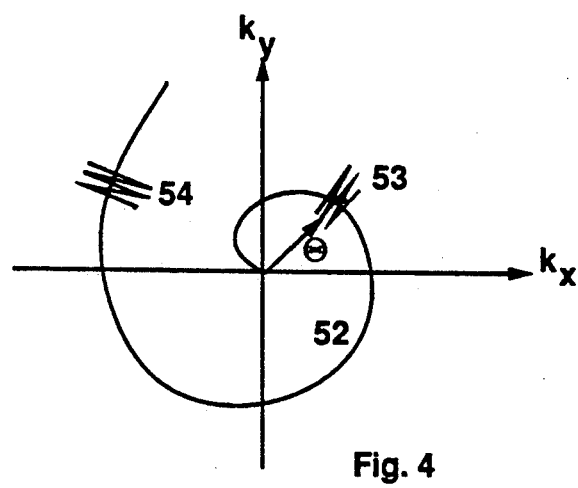
Figure 5:
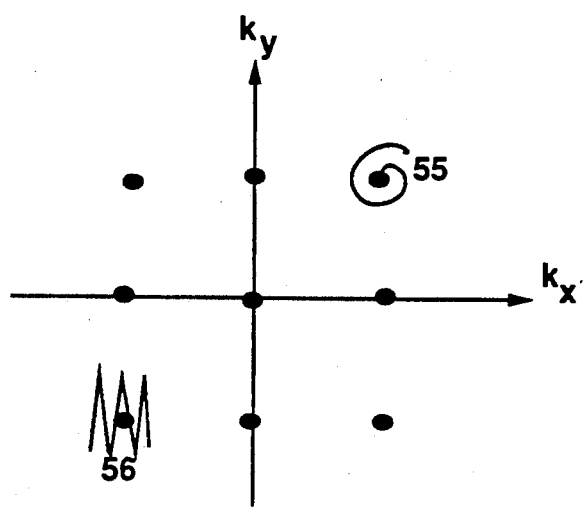

FIG. 4 is an illustration of waveforms used in an embodiment of the using a two-dimensional scan; and FIG. 5 is an illustration of waveforms used with an embodiment using two-dimensional sampling.

DESCRIPTION OF THE PREFERRED EMBODIMENT

It is desired to create a magnetic resonance image of object 10, which is often a portion of the human body. The magnetic resonance imaging system shown uses all of the standard components including a strong homogeneous field in the z direction $B_o$ and a set of gradient coils which provide fields in the z direction with linear variations in x, y, and z. As shown, coil 11 driven using terminal 16 represents the y gradient and coil 12 driven by generator 29 represents the x gradient. The y gradient signal 16, $G_y'$ is made up of a the standard gradient signal 14, $G_y$, whose integral provides the scan of k space in the y dimension plus an added high-frequency periodic signal from generator 15, which is the subject of this invention. Normally, in a typical 2DFT, scan pattern, the $G_x$ gradient is constant during the scan, while the $G_y$ gradient is pulsed prior to data acquisition to provide each $k_y$ line. In this operation the periodic nature of the sampled $k_y$ axis results in aliasing of the object. Here, the signal 15 "smears" the lines in the $k_y$ direction, corresponding to a limiting of the object space in the y dimension.

Figure 1:
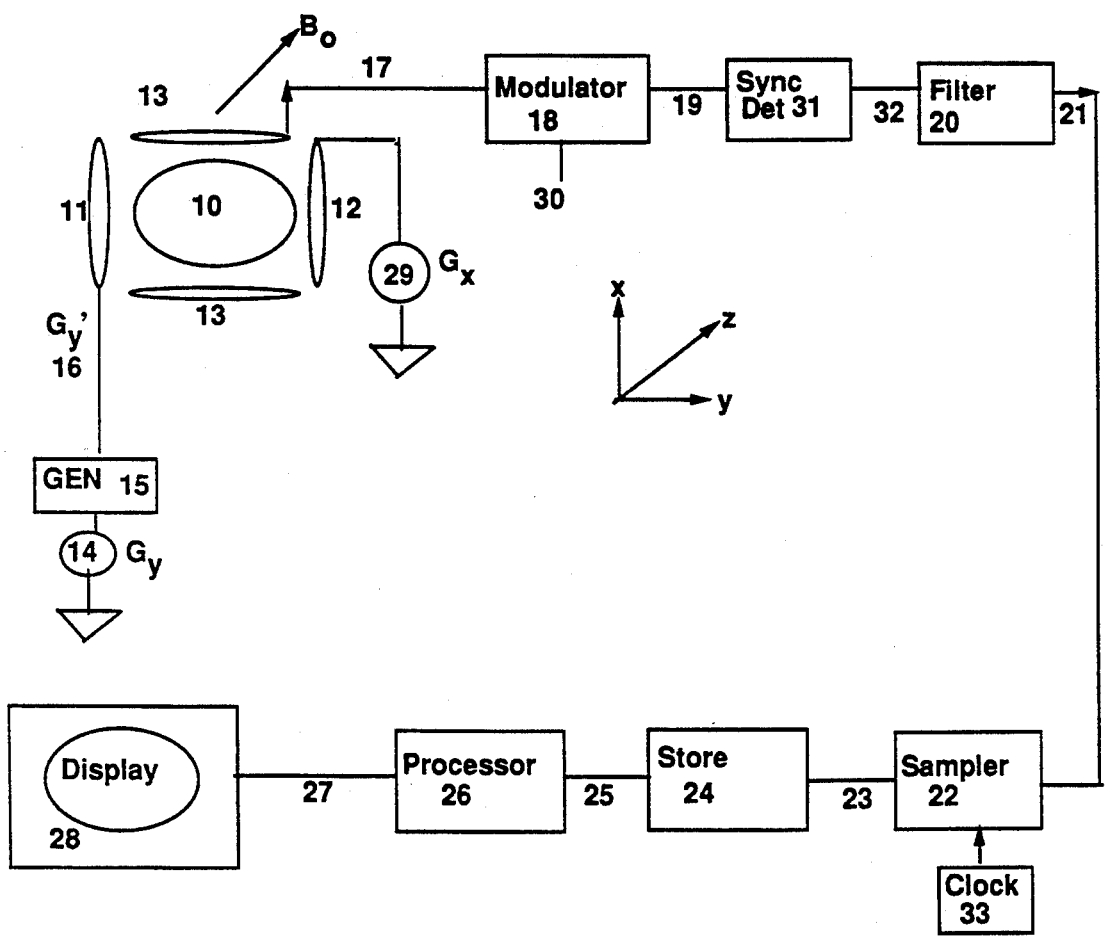
FIG. 1 is a diagram of an embodiment of the invention.

The remainder of the MRI system, as shown in FIG. 1, is similar to existing systems. Coils 13 are used to pickup the radiated signal to form antenna signal 17. Here a specialized modulator, 18, is used to modulate the received signal at the same rate as the, as that of generator 15. In this way the blur function in the $k_y$ direction can be carefully controlled so as to accurately determine the space limits of the object image. Signal 19, containing the modulated antenna signal is demodulated into baseband I and Q signals 32 using synchronous demodulator 31. Signals 32 are then low-pass filtered in filter 20 to remove these high frequency variations prior to sampling. Thus signal 23, devoid of the high-frequency components, is sampled by sampler 22 at a rate such that each sample will represent the integration over the "smear" in the $k_y$ direction. This thus represents a convolution of the k space in the y direction. The inverse transform of this convolution function is the space-limiting in the y direction.

The sampled signal 23 is applied to a digital store 24 where the samples 25 are subsequently processed into the desired image in processor 26 to provide video signal 27 which is displayed in 28. The processor 26 is generally a Fourier Transform operation to convert the transform into an image followed by a magnitude operation.

As previously described, the basis of this invention is limiting the spatial extent of the object, to avoid aliasing, by "blurring" or convolving the points in the transform. Thus each sample point, prior to the transform operation in 26, must correspond to a "smear" or "blur", rather than a point in k-space as in existing systems. This is accomplished by providing a high-frequency oscillation in k-space, and low pass filtering out this oscillation prior to sampling. The shape or distribution of this blur will determine the space-limiting function. This is determined by the added gradient signal 16 and by the modulator signal 30.

Many of the details of the magnetic resonance imaging system are not shown since they are not relevant to the invention. Signal 19, the processed antenna signal, is usually demodulated into baseband I and Q signals. Thus the filter 20 can represent the low-pass filtering of both the I and Q signals following demodulation. These are individually sampled so that two samplers are used, creating a digital store of complex values, two for each data point.

Figure 2A:
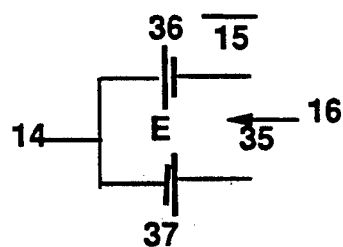
FIG. 2 is a diagram of a generator embodiment of the invention.
FIGS. 2B and 2C are waveforms used in this embodiment of the invention.
Figure 2B:
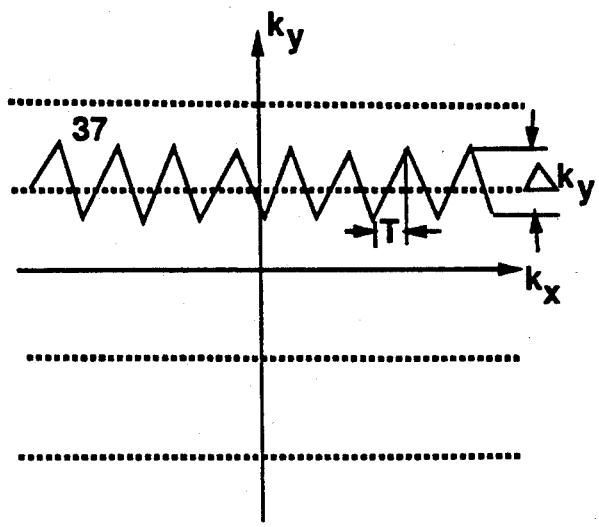

A representative smearing or convolution function is shown in FIG. 2. FIG. 2A illustrates an embodiment for the added gradient waveform for generator 15. This consists of a voltage which is switched back and forth between $+E$ and $-E$ using switch and sources 36 and 37, creating a square wave. The switch connects to each source for a time T, Therefore $k_y$ gets an added sawtooth the integral of a square wave This sawtooth 37, shown in FIG. 2b, is labeled $\Delta k_y$. This sawtooth is superimposed on the lines of the normal k-space scan, forming a convolution in the $k_y$ direction. If modulator 18 is not used, this provides a convolution with a "rect" or rectangular function. Therefore the object is multiplied by the transform of a rect, or a sinc function. This will prevent aliasing by limiting the size of the imaged region.

Figure 2C:
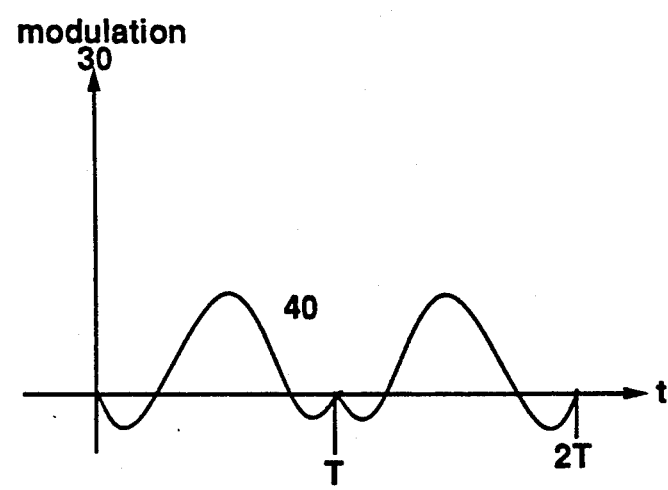

A sinc function is not an ideal space-limiting function because of its soft edges and ringing. To provide a more suitable function modulator 18 is used which varies the gain of the received signal at the same rate as the added generator signal 15. As shown in FIG. 2c, the modulator signal is a periodic sinc function. This shaping of the "smearing" function approximates the convolution in the $k_y$ direction with a sinc function. The transform of a sinc function is a rect, a highly desirable space-limiting function for eliminating aliasing. Thus waveform 40, a periodic sinc function repeating at an interval T is used as modulator signal 30.

For some typical numbers, assume it is desired to limit the imaging region to 10 cm. With the sinc function shown, the peak change in $k_y$ of signal 37 will be 0.6 cycles/cm. If each half of the triangular wave 37 has a duration T, where T=10 usec. This corresponds to a peak gradient amplitude of about 5 gauss/cm. This is a relatively high value for a general gradient amplifier. However, where the only waveform is the squarewave generated by switch 35, it should be readily achievable. Also, continuous high frequency waveforms of this type generally do not cause nerve stimulation, as is the case with the radio frequency signal in conventional MRI. The sampling rate of clock 33 in sampler 22 would preferably have a period equal to an integer times T, the time of half the triangular waveform, so that each sample represents the filtering over the oscillated region of $k_y$. Thus the sampling rate can be 100 khz. Filter 20 must cutoff before 50 khz to filter the modulated signal and prevent aliasing.

In some cases it may be difficult to generate the square wave of FIG. 2A at the amplitudes required. In that case resonant phenomena can be used to provide an efficient sinusoidal scan of k-space. As illustrated in FIG. 3A, sinusoidal generator 47 is applied to gradient terminal 16 through capacitor 46 which resonates with the inductance L of y gradient coil 11 at the sinusoidal scanning frequency of about 50 khz. The sinusoidal signal will appear across the source impedance of gradient generator 14. This provides a sinusoidal scan of k-space added onto the conventional scan as shown as 48 in FIG. 3B. The blurring effect is somewhat different since we now have a nonuniform scanning velocity where each part of k space is weighted by $1/|k'|$, the reciprocal of the derivative of the k-space scan. Stated simply, at the ends of the sinusoid, where the scan slows down, the effective gain at that region is increased. Similarly, in the center region of the sinusoid the scan speeds up, decreasing the effective gain. This can be compensated for by modifying modulator signal 30 to include the effect of the velocity. As shown in FIG. 3C a signal 50 is developed which is the reciprocal of the magnitude of the velocity in the k-space scan. This is multiplied by sinc function 40 to provide signal 51 for modulator signal 30 in FIG. 3D. This signal, with reduced lobes, provides the desired sinc response, taking into account the non-uniform sinusoidal scan.

Although the waveforms shown in FIGS. 2 and 3 are practical and typical of those desired, a wide class of different functions can be used in different situations to provide differing object limitations. The resultant overall function will always be the product of the modulator function 30 and $1/|k'|$ of scanning function 15. Also modulator 18 could provide phase shifting in addition to amplitude modulation allowing for more complex operations such as shifting the position of the object limiting function.

Stated more generally, two factors determine the shape of the blurring function, which in turn determines the object limiting dimensions. Firstly, the velocity of the scan through k space determines the effective gain or intensity in each local region. When the scan is very rapid, spending little time in each region, the resultant gain is low, an vice-versa. Thus the first gain function, as stated, is $1/|k'|$ where $|k'|$ is the magnitude of the derivative of k(t). For very rapid parts of k(t), where $|k'|$ is high, the gain will be low, etc. Since the scan k(t) is symmetrical, such as a sinusoid or square wave, this will apply equally to each half of the waveform. While this scan takes place, the resultant received signal is modulated by modulator 18, providing the second factor determining the shape of the blur function. This modulator simply multiplies the signal by signal 30. This signal goes through a complete period for every half-period T of the k-space scan as shown in FIGS. 2B and 2C. Thus during each traversal of the blurring waveform, the signal is amplitude modulated to provide the desired function. The resulting blurring function is the product of $1/|k'|$ and the modulator signal. Therefore the space-limiting function is the Fourier transform of this product.

With the methods shown an object can be limited in both dimensions where frequency filtering limits the x dimension and the shaped blurring signal limits the y dimension. For non-cartesian scans, such as the spiral 52, of FIG. 4, the blurring function is in the radial dimension. This is accomplished by using generator 15 on both the x and y gradient coils, 11 and 12. The blurring function has the same amplitude at each point in the spiral but is apportioned differently between x and y. The x amplitude is the full amplitude multiplied by $\cos\theta$ while the y amplitude varies as $\sin\theta$. Thus generators 15 will have a control function, not shown, based on the x and y gradient signals, 29 and 14, which will modulate the individual amplitudes of the oscillating blurring functions. Typical sample points 53 and 54 show the radial nature of the blurring. The modulator 18 will be unchanged.

Another application is the 3DFT system, usually used in spectroscopic imaging where, using phase encoding on the x and y axes, k space is traversed as a series of samples shown in FIG. 5. To provide the required two-dimensional blurring, to avoid aliasing in either dimension, a two-dimensional local scan is used during the readout interval. One approach is the use of a small spiral scan, 55, involving quadrature sinusoids on each axis with increasing amplitude or decreasing frequency. Another approach is a Lissajou pattern 56 using sinusoids of different frequencies on the x and y gradients. These waveforms must be relatively high speed since the entire local scan time must be equal to or less than the sampling period of the signal.

In each of the embodiments used, the additional waveforms to prevent aliasing were superimposed on the standard gradient waveform driving the standard gradient coils. However, for this operation, it may prove advantageous to use separate gradient coil windings for this additional convolving waveform. These could be designed for the waveform to be used. For example, using sinusoidal waveforms, the additional coil would be designed to be part of a resonant circuit.

The embodiments shown all dealt with two dimensions of k-space. In most cases, the third dimension is provided by slice selection, which takes place during the excitation period. In the case where three dimensional scanning of k-space is used, the third dimension can be defined again by selective excitation. Alternatively it can be limited by the extent of the object being studied or the sensitivity of a receiver coil. Finally, the system of FIG. 5 using phase-encoding could be used for two of the dimensions, with a constant gradient linear scan during readout for the third dimension. Here the extent of the two dimensions would be limited by scans 55 or 56 while the extent in the third dimension would be limited by the bandwidth of the readout system.

I claim:

1. In a method for imaging precessing magnetic moments of an object within a volume using magnetic resonance imaging the steps of:
    scanning k-space of the object using a sequence of magnetic gradient waveforms in at least two spatially orthogonal axes;
    applying a first periodic waveform to at least one magnetic gradient axis which is superimposed on the gradient waveforms providing the k-space scan to provide a convolution operation which will substantially prevent aliasing of the image of the object;
    receiving signals produced by the precessing magnetic moments in the object at each point of the k-space scan;
    low-pass filtering the received signals at a cutoff frequency lower than the frequency of the periodic gradient waveform;
    sampling the received signal; and
    transforming the samples into an image of the object.

2. The method as described in claim 1 including the step of modulating the received signals with a second periodic waveform having a periodicity based on the periodicity of the first periodic waveform.

3. Apparatus for imaging precessing magnetic moments of an object within a volume using magnetic resonance imaging comprising:
    means for scanning k-space of the object using a sequence of magnetic gradient waveforms in at least two spatially orthogonal axes;
    means for applying a first periodic waveform to at least one magnetic gradient axis which is superimposed on the gradient waveforms providing the k-space scan to provide a convolution operation which will substantially prevent aliasing of the image of the object;
    means for receiving signals produced by the precessing magnetic moments in the object at each point of the k-space scan;
    means for low-pass filtering the received signals at a frequency lower than the frequency of the periodic gradient waveform;
    means for sampling the received signal; and means for transforming the samples into an image of the object.

4. Apparatus as described in claim 3 where the first periodic waveform in k-space is a triangular waveform.

5. Apparatus as described in claim 4 where the triangular waveform is generated by applying a square wave to a gradient coil.

6. Apparatus as described in claim 3 where the first periodic waveform is a sine wave.

7. Apparatus as described in claim 3 including means for modulating the received signals with a second periodic waveform having a periodicity based on the periodicity of the first periodic waveform.

8. Apparatus as described in claim 7 where the first periodic waveform is symmetric and the second periodic waveform has a periodicity twice that of the first periodic waveform.

9. Apparatus as described in claim 8 where the Fourier transform of one period of the second periodic waveform divided by the magnitude of the derivative of one half period of the first periodic waveform substantially represents the space-limiting function surrounding the image of the object.

* * * * *